United States Patent [19]

Fitzsimmons et al.

[11] Patent Number: 5,240,878
[45] Date of Patent: Aug. 31, 1993

[54] METHOD FOR FORMING PATTERNED FILMS ON A SUBSTRATE

[75] Inventors: John A. Fitzsimmons, Poughkeepsie; Janos Havas, Hopewell Junction; Margaret J. Lawson, Newburgh; Edward J. Leonard, Fishkill; Bryan N. Rhoads, Pine Bush, all of N.Y.

[73] Assignee: International Business Machines Corporation, Armonk, N.Y.

[21] Appl. No.: 691,951

[22] Filed: Apr. 26, 1991

[51] Int. Cl.$^5$ .................................. H01L 21/283
[52] U.S. Cl. .......................... 437/187; 437/228; 437/229; 437/944; 148/DIG. 100
[58] Field of Search .......... 437/944, 187, 229, 228; 148/DIG. 100

[56] References Cited

U.S. PATENT DOCUMENTS

| | | | |
|---|---|---|---|
| 4,004,044 | 1/1977 | Franco | 427/43 |
| 4,040,891 | 8/1977 | Chang et al. | 437/228 |
| 4,410,622 | 10/1983 | Dalal | 430/312 |
| 4,519,872 | 5/1985 | Anderson, Jr. et al. | 437/944 |
| 4,539,222 | 9/1985 | Anderson, Jr. et al. | 437/228 |
| 4,803,181 | 2/1989 | Buchmann | 437/228 |
| 4,861,732 | 8/1989 | Fujimura | 437/229 |
| 4,886,728 | 12/1989 | Salamy | 430/331 |
| 5,091,103 | 2/1992 | Dean et al. | 252/169 |

FOREIGN PATENT DOCUMENTS

| | | | |
|---|---|---|---|
| 52-28261 | 3/1977 | Japan | 437/944 |
| 58-91640 | 5/1983 | Japan | 437/944 |
| 2-139559 | 5/1990 | Japan | |
| 2-183255 | 7/1990 | Japan | |

OTHER PUBLICATIONS

"Image Reversal Lift-off Process wiring a release layer", IBM Tech. Disc. Bull., vol. 29, No. 11, Apr. 1987, p. 4935.

IBM Technical Disclosure Bulletin, vol. 19, No. 4, Sep. 1976, "Stripping Promotor for Lift-off Mask", by P. Carr et al.

Primary Examiner—Olik Chaudhuri
Assistant Examiner—Ourmazd S. Ojan
Attorney, Agent, or Firm—Richard A. Romanchik; Michael J. Balconi-Lamica

[57] ABSTRACT

A method of forming patterned films on a semiconductor substrate 10 includes the steps of depositing a hardened photo resist underlay 30 onto the substrate, then depositing a polyether sulfone release layer 32, then depositing a photo sensitive resist layer 34 and exposing an etching a metallization pattern 36, 38 to the substrate 10. The structure is then blanket deposited with a conductive layer 40 to thereby create a conductive contact stud 42. The film layer 40 and resist layer 34 are removed by dissolving the polyether sulfone layer 32 in an NMP solution and the photo resist underlayer 30 is then removed using a selective photo resist stripper composition.

4 Claims, 2 Drawing Sheets

METHOD FOR FORMING PATTERNED FILMS ON A SUBSTRATE

TECHNICAL FIELD OF THE INVENTION

The present invention relates to semiconductor manufacturing processes, and more particularly, the fabrication of patterned films on semiconductor substrates.

BACKGROUND ART

The continuing improvements in semiconductor integrated circuit technology have resulted in the capability of forming increased numbers of transistors, resistors, etc., within a given semiconductor chip. For example, the advent of ion implantation has allowed devices to be smaller and improved masking and isolation techniques have allowed devices to be more closely spaced. This overall miniaturization effect has resulted in decreased cost and improved performance in integrated circuits. Unfortunately, though, many of the devices formed within the semiconductor chip must remain unused in the completed chip because of the lack of available space for wiring all of the circuits together.

For example, a practical state of the art integrated circuit chip containing between 700-2,000 circuits typically utilizes less than 50% of the available circuits. The principle reason for this is the inadequate space available on the surface of the chip for wiring all of the circuits. The interconnection metallurgy system atop the chip is extremely complex and bulky, requiring the spacing between the wires to be very tight. To achieve even a 50% efficiency of circuit utilization, at least 2 or 3 and possibly 4 separate levels of complex conductive wiring patterns, each separated by one or more layers of dielectric material, are used.

One solution to solving the above mentioned interconnection wiring problem is found in advanced bipolar semiconductor products, wherein metal studs are employed to provide contact between circuit components and their interconnect wiring. These metal studs are essential for efficient utilization of chip real estate and in maintaining a planar wiring structure essential for both high performance and reliability. The relatively small diameter and large height of the contact stud, however, imposes particular problems and therefore limits the number of methods suitable for their construction. A prior technique for forming metal studs of this nature is disclosed in commonly owned U.S. Pat. No. 4,410,622 (Dalal, et al.). FIGS. 1A-1D provide a simplified illustration of the method for forming metal contact studs atop a semiconductor substrate according to Dalal et al. First, a polyether sulfone layer is deposited on top of the substrate, followed by the deposition of an organic polymer material such as a novolak resin based (NVR) positive resist. The NVR layer is then baked to 210° C.-230° C. to render it photoinsensitive. A photosensitive resist layer is then deposited on the NVR layer, and a pattern is transferred to the substrate by exposing the pattern through the photoresist material and then etching through the NVR and the polyether sulfone layer. Dalal, et al. discloses leaving the entire polyether sulfone layer intact, although it is desirable to have a pattern which is etched to the semiconductor substrate. Blanket deposition of a metallization layer thereby leaves a metallic stud deposited on top of the semiconductor substrate. Removal of the metallization, NVR, photoresist, and metallization layer is accomplished by dissolving the polyether sulfone layer using N-methylpyrrolidone (NMP) or other suitable solvent, thereby quickly lifting off these layers and leaving only the metal stud deposited on the substrate.

Referring now to FIG. 1A, the prior method for depositing metal studs includes the initial step of depositing a polyether sulfone layer 12 onto a semiconductor substrate 10. A novolak resin based positive resist layer 14 is then deposited onto the polyether sulfone layer 12. The positive resist layer 14 is then baked at a temperature range of about 210° C. to 230° C. in order to render it photo insensitive. Atop the resist layer 14 is deposited a photosensitive resist layer 16.

Referring now to FIG. 1B, the resist layer 16 is subjected to radiation and is developed in a manner well known in the prior art, to thereby provide a relief pattern image 18. The resist mask is then used to facilitate selective removal of the underlying layers 14 and 12 to expose a window 20 therein. It is to be noted that there may be millions of such windows formed atop the semiconductor substrate 10. Window 20 is merely exemplary of one such window. The technique of forming the windows and layers 14 and 12 is well known in the prior art.

Referring now to FIG. 1C, after the window 20 is formed, a metal layer 22 is blanket deposited over the entire structure, thereby forming a metal stud 24 onto semiconductor substrate 10 in window 20.

Referring now to FIG. 1D, the layers 14, 16, 22 are then quickly lifted off by using NMP or another suitable solvent to dissolve and release the polyether sulfone layer 12, thereby leaving the pattern metal stud 24 adhered to the surface of the semiconductor substrate 10. During the lift-off process, residue polyether sulfone (not shown) might remain and can be removed by dissolving it in a suitable solvent, such as NMP, in an additional step.

This method is unsuitable, however, because during the lift-off process the studs are damaged from the impact of the lift-off layers 12, 14, 16 and 22. One of the damage conditions is referred to as "tilted stud" and is illustrated in FIG. 1D. With this condition, the stud is still able to make electrical connection. However, the area of electrical connection is significantly reduced, thereby leading to a potentially unreliable connection some time in the future, when repairing such a defect or replacing the part is extremely expensive. It is evident from FIGS. 1A-1D that the lift-off structure has significantly more mass than the studs.

Dalal et al. therefore provides a method of forming metal studs by utilizing the sensitivity of a polyether sulfone underlay, which is first deposited onto the substrate, to NMP. This process is unacceptable for the smaller semiconductor structures utilized at the present time, however, because damage occurs to the studs during the lift off process. This is due to the fact that the studs comprise only a small percentage of the overall area of the substrate, with the structure which is lifted off taking up the remaining area. As a result, the structure comprising the polyether sulfone, NVR, photoresist and metallization layer collides with the metal studs during the lift off process, thereby causing impact damage to the studs. It is to be noted that damage to even a single metal structure is a potential reliability problem which warrants rejection of an entire chip.

A method of producing undamaged, reliable metallurgy which overcomes the deficiencies of the prior art, is therefore, highly desirable.

DISCLOSURE OF THE INVENTION

The object of the present invention is to provide for an improved method of forming patterned films on a semiconductor substrate which minimizes damage to the patterned material deposited.

According to the present invention a patterned film formation process includes the steps of depositing a photoresist underlay; hardening the photoresist underlay by baking, thereby rendering it insoluble in NMP; depositing a polyether sulfone release layer; depositing an exposure photoresist layer; patterning a film pattern through the exposure photoresist layer, polyether sulfone release layer and photoresist underlayer; depositing a film layer, thereby leaving a structure in the patterned opening; dissolving the polyether sulfone release layer using NMP; and, dissolving the photoresist underlayer utilizing a selective resist stripper comprising N-alkyl-2-pyrrolidone, 1,2-propanediol and tetraalkylammonium hydroxide.

The present invention provides for the formation of a dense pattern of structures deposited onto a semiconductor substrate, which are protected by the photoresist underlay during removal of the polyether sulfone and film layer. Consequently, the structure remains undamaged during the manufacturing processes after their formation, thereby improving manufacturing yields and device reliability.

These and other objects, features and advantages of the present invention will become more apparent in light of the detailed description of exemplary embodiments thereof as illustrated by the drawings.

BEST MODE FOR CARRYING OUT THE INVENTION

The present invention is a method of depositing a patterned film onto a substrate. For example, the formation of metal contact studs onto a semiconductor substrate. For exemplary purposes, a method of forming metal contact studs is described hereinafter, as illustrated in FIGS. 2A-2E. It is to be noted, however, that other types of both conductive and nonconductive patterned films may be deposited utilizing the method of the present invention.

Figure 1A:
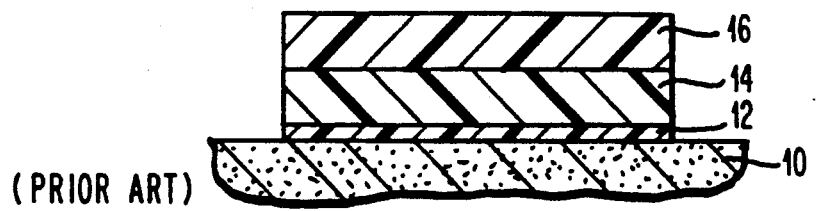
FIGS. 1A-1D are diagrammatic cross-sectional views of a structure being fabricated in accordance with the method of the prior art.
Figure 1B:
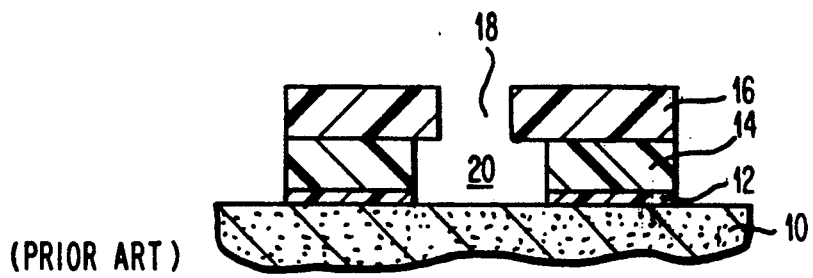
Figure 1C:
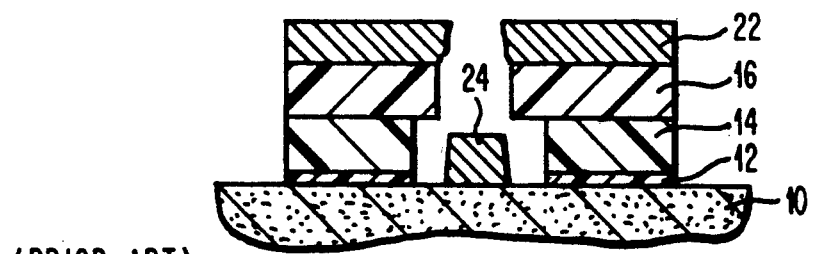
Figure 1D:
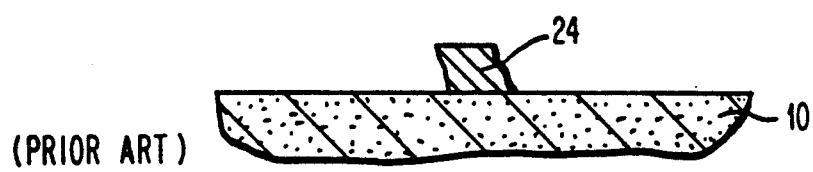
Figure 2A:
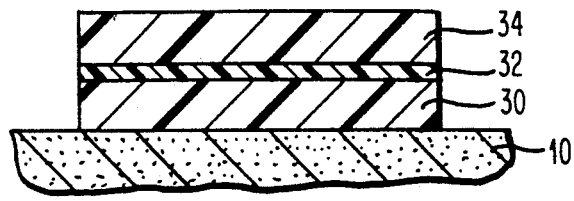
FIGS. 2A-2E are diagrammatic cross-sectional views of a structure being fabricated in accordance with the method of the present invention.

Referring now to FIG. 2A, a method of forming metal contact studs on a semiconductor substrate according to the present invention begins with the deposition of a photoresist underlayer 30 onto a semiconductor substrate 10. The underlayer may be any polymeric material used in coating which: a) exhibits good adhesion to the substrate 10; b) is thermally stable; c) is removable by reactive etching; and, d) is soluble in a selective resist stripper solution which will be described in greater detail hereinafter. The preferred material for the underlayer is an organic polymeric masking material, such as an AZ-1350 type polymer, which comprises a novolak type phenol-formaldehyde resin and a photosensitive cross-linking agent, and is commercially available from the Hoechst Celanese Corporation. Other suitable materials include synthetic resins such as polymethyl methacrylate, diazo type photoresists and polyimides. The thickness of the underlayer 30 determines the height of the studs to be produced. In the present invention an underlayer of approximately 2.8 microns is suitable. The preferred method of the underlayer 30 deposition is by spin coating, although other deposition techniques known in the prior art may be utilized.

The underlayer 30 is then baked at approximately 210° C. for approximately 30 minutes in a convection oven in order to: a) render it thermally stable under metal deposition conditions; b) render it insoluble in NMP; and c) change its mechanical bonding strength with overlaying materials, as will be discussed in greater detail hereinafter. Conditioning the underlay 30 in this manner, and thereby changing its solubility characteristics is commonly referred to as cross-linking the material.

Next, a thin polyether sulfone layer 32 approximately 2,000-3,000 Å thick is spin coated onto the underlayer 30. The polyether sulfone layer 32 is then baked on a hot plate at approximately 220° C. for about 5 minutes in order to remove all solvents from the material.

Next, a photo sensitive exposure or pattern resist layer 34 approximately 1 micron thick is deposited onto the polyether sulfone layer 32. The preferred material for the resist layer 34 may be a material such as part number AZ4110 manufactured by the Hoechst Celanese Corporation.

Figure 2B:
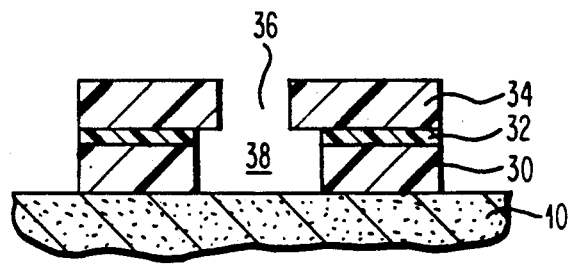

Referring now to FIG. 2B, the next step in the process of the present invention is to expose and develop a predetermined metallization pattern 36 through photoresist layer 34, polyether sulfone layer 32 and underlayer 30 by any of a number of techniques well known in the prior art. For example, the photoresist layer 34 can be exposed and developed with a positive image of the metallization pattern. Next, the remaining photoresist is conditioned in order to render it resistant to reactive ion etching (RIE). The preferred method of conditioning is to silylate the photoresist 34 by immersing it in a heated solution (about 50° C.) of 10% hexamethylcyclotrisilazane (HMCTS) and 90% xylene for about 10 to 30 minutes. After photoresist conditioning the wafer is rinsed clean in an appropriate solvent, such as xylene, dried and then baked at a temperature range of about 160° C. to 210° C. for about 30 minutes. The metallization pattern 36 is then transferred through the polyether sulfone layer 32 and underlayer 30 to the substrate 10 by an oxygen RIE to thereby create a metallization pattern 38 which slightly undercuts the pattern 36 in the photosensitive resist layer 34. Undercutting of the the pattern 36 assures that all material of layer 34 is removed in the locations of the desired openings.

It is to be noted that other techniques, not illustrated herein, may be utilized to transfer a metallization pattern to the substrate 10 after deposition of the polyether sulfone layer 32. One such alternative technique is to: first deposit a barrier layer (BL) which is resistant to oxygen RIE (e.g. silicon nitride, an organic spun-on glass, or silicon dioxide) onto the polyether sulfone layer 32; then deposit a photosensitive resist layer, (such as mentioned above), onto the barrier layer; then expose and develop the metallization pattern through the photosensitive resist layer; then transfer the pattern through the barrier layer using a $CF_4$ RIE process; and, then transfer the pattern through the polyether sulfone layer 32 and resist layer 30 to the substrate 10 using an oxygen RIE.

Figure 2C:
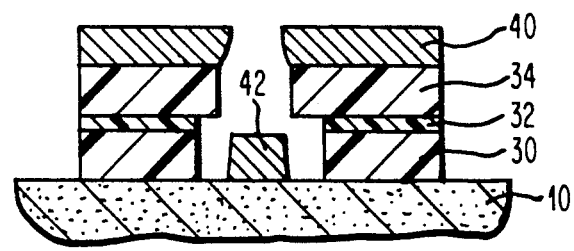

Referring now to FIG. 2C, the next step of the process of the present invention is blanket deposition of a metallization layer 40 over the existing structure. The deposition of metal layer 40 may be any of a number of methods well known in the prior art, such as an evaporate ion process. The deposition step creates a metal stud 42 which is deposited onto the semiconductor substrate 10.

It is to be noted that prior to the deposition of the metallization layer, various surface cleaning methods, such as Argon ion sputtering or buffered HF, may be utilized to improve electrical contact between the metallurgy and the substrate 10.

Figure 2D:
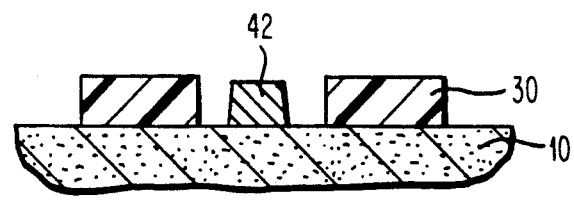

Referring now to FIG. 2D, the next step in the process of the present invention is to remove the layers 32, 34, and 40. This may be accomplished by a number of methods, including immersing the structure in a NMP bath such as disclosed in Dalal, et al, which will remove layer 32 and overlying layers 34, 40 thereby leaving stud 42 and protective layer 30.

Alternatively, layers 34 and 40 may be removed by mechanically stripping them away from the polyether sulfone layer 32 and the underlayer 30 by applying an adhesive backed polymer film or tape (not shown), such as tape catalog no. 850 manufactured by the 3M Corporation, to the top of the metallization layer 40 and applying a pulling/stripping force to the tape. Conditioning or cross-linking the underlayer 30 described hereinbefore ensures that the polyether sulfone release layer 32/resist layer 34 mechanical bond is weaker than the stripping tape/metallization layer 40; metallization layer 40/photoresist layer 34; and underlayer 30/substrate 10 mechanical bonds. Therefore, all of the layers above the underlayer 30 will be stripped away with the tape.

It is to be noted that in both of the above mentioned lift-off or removal processes, the metal stud 42 is protected by the underlayer 30, thereby preventing any of the damage which rendered prior stud formation processes unacceptable.

Figure 2E:
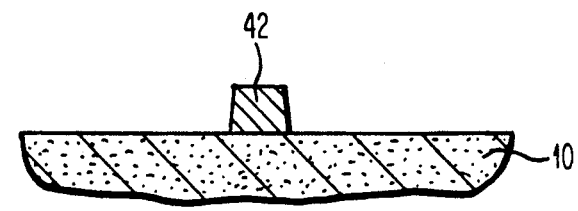

Referring now to FIG. 2E, the next step in the process of the present invention is to remove the underlayer 30 from the semiconductor substrate 10, thereby leaving only the stud 42. This may be accomplished by a number of methods, including:

a) removing the underlayer 30 through the use of an extensive oxygen ash in a plasma ashing tool and then immersing the structure in a post-ash buffered hydrofluoric acid (BHF) to remove the residue left over from the ashing process; or b) removing the underlayer 30 by immersing the structure in a photoresist stripper composition such as N-alkyl-2-pyrrolidone, 1,2-propanediol and tetraalkylammonium hydroxide.

Oxygen ashing processes are well known in the prior art and will not be described herein in detail.

Utilizing the photoresist stripper solution to remove the underlayer 30 is preferable over the ashing process because the residue which is typically left over from an ashing process causes device contamination problems. Also, damage to the metal contact studs 42 and the silicon substrate 10 can occur due to the prolonged exposure to BHF. Commonly owned U.S. patent application Ser. No. 07/517,105 (filed on May 1, 1990) discloses the preferred photo resist stripper composition to be utilized in removing the underlayer 30 according to method b) above, and is incorporated in its entirety herein by reference. The preferred photo resist stripper composition for the process of the present invention comprises 60-90% by weight of a N-alkyl-2-pyrrolidone; 10-14% of 1,2-propanediol; and, a sufficient amount of a tetraalkylammonium hydroxide to provide a solution being from 0.1 to 0.22N. The underlayer should be immersed in this stripper composition at a temperature of about 105°-135° C. for more than 15 minutes. The substrate must then be rinsed and cleaned using methods well known in the prior art.

Although the invention has been shown and described with exemplary embodiments thereof, it should be understood by those skilled in the art that the foregoing and various other changes, omissions and additions may be made therein and thereto without departing from the spirit and scope of the invention.

What is claimed is:

1. A method of forming patterned films onto a semiconductor substrate comprising the steps of:

a) depositing a first layer of a first material, wherein said first material is comprised of an organic polymeric masking material;

b) conditioning said first layer to be thermally stable under deposition conditions required for film formation and to have a first mechanical bonding strength with a release material, the conditioned first layer further being soluble in a stripper solution;

c) depositing a release layer of said release material onto said first layer;

d) patterning a film pattern through said first and said release layers;

e) depositing a film layer to thereby form film onto the semiconductor substrate in the said film pattern;

f) removing all layers above said conditioned first layer by applying an adhesive backed tape to said film layer and applying a pulling force to said tape; and, g) dissolving said conditioned first layer in said stripper solution.

2. A method of forming patterned films onto a semiconductor substrate comprising the steps of:

a) depositing a first layer of a first material;

b) conditioning said first layer to be thermally stable under deposition conditions required for film formation and to have a first mechanical bonding strength with a release material, the conditioned first layer further being soluble in a stripper solution, wherein said stripper solution is comprised of N-alkyl-2-pyrrolidone, 1,2-propanediol and tetraalkylammonium hydroxide;

c) depositing a release layer of said release material onto said first layer;

d) patterning a film pattern through said first and said release layers;

e) depositing a film layer to thereby form film onto the semiconductor substrate in the said film pattern;

f) removing all layers above said conditioned first layer by applying an adhesive backed tape to said film layer and applying a pulling force to said tape; and, g) dissolving said conditioned first layer in said stripper solution.

3. A method of forming patterned films onto a semiconductor substrate comprising the steps of:

a) depositing a first layer of a first material;

b) conditioning said first layer to be thermally stable under deposition conditions required for film formation and to have a first mechanical bonding strength with a release material, the conditioned first layer further being soluble in a stripper solution, wherein said stripper solution is comprised of:
  i) 60-90% by weight of a N-alkyl-2-pyrrolidone;
  ii) 10-40% by weight of a 1,2-propanediol;
  iii) a sufficient amount of a tetraalkylammonium hydroxide to provide a solution being from 0.1 to 0.22N;
c) depositing a release layer of said release material onto said first layer;
d) patterning a film pattern through said first and said release layers;
e) depositing a film layer to thereby form film onto the semiconductor substrate in the said film pattern;
f) removing all layers above said conditioned first layer by applying an adhesive backed tape to said film layer and applying a pulling force to said tape; and,
g) dissolving said conditioned first layer in said stripper solution.

4. A method of forming patterned films onto a semiconductor substrate comprising the steps of:
a) depositing a first layer of a first material;
b) conditioning said first layer to be thermally stable under deposition conditions required for film formation and to have a first mechanical bonding strength with a release material, the conditioned first layer further being soluble in a stripper solution;
c) depositing a release layer of said release material onto said first layer, wherein said release material is comprised of polyether sulfone;
d) patterning a film pattern through said first and said release layers;
e) depositing a film layer to thereby form film onto the semiconductor substrate in the said film pattern;
f) removing all layers above said conditioned first layer by applying an adhesive backed tape to said film layer and applying a pulling force to said tape; and,
g) dissolving said conditioned first layer in said stripper solution.

* * * * *